(12) United States Patent
Koe et al.

(10) Patent No.: US 7,605,732 B2
(45) Date of Patent: Oct. 20, 2009

(54) SYSTEMS AND METHODS FOR KICKBACK REDUCTION IN AN ADC

(75) Inventors: Wern M. Koe, Dallas, TX (US);
Yong-In Park, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/668,006

(22) Filed: Jan. 29, 2007

(65) Prior Publication Data
US 2008/0180291 A1  Jul. 31, 2008

(51) Int. Cl.
*H03M 3/00* (2006.01)
(52) U.S. Cl. .................. 341/142; 341/155; 341/172
(58) Field of Classification Search .......... 341/143, 341/155, 172
See application file for complete search history.

(56) References Cited

U.S. PATENT DOCUMENTS

| 6,639,946 B2 * | 10/2003 | Wu et al. ............... 375/247 |
| 6,933,871 B2 * | 8/2005 | Melanson et al. ....... 341/143 |
| 6,954,159 B1 * | 10/2005 | Cooper et al. .......... 341/143 |
| 6,956,514 B1 * | 10/2005 | Melanson et al. ....... 341/143 |
| 7,081,843 B2 * | 7/2006 | Melanson ............... 341/143 |
| 7,119,608 B2 * | 10/2006 | Doerrer ................. 327/552 |
| 7,193,546 B1 * | 3/2007 | Melanson ............... 341/143 |
| 7,230,556 B2 * | 6/2007 | Rivoir .................. 341/143 |
| 7,298,308 B1 * | 11/2007 | Rueger et al. .......... 341/143 |
| 7,423,567 B2 * | 9/2008 | Melanson ............... 341/143 |
| 2002/0030617 A1 * | 3/2002 | Haroun et al. .......... 341/143 |
| 2002/0118128 A1 | 8/2002 | Siferd |
| 2006/0109153 A1 | 5/2006 | Gupta |

OTHER PUBLICATIONS

Silva, J. et al., "Wideband Low-Distortion Delta-Sigma ADC Topology", Jun. 7, 2001, Electronics Letters, vol. 37, No. 12.
Lee W. Young, authorized officer, International Searching Authority, Notification of Transmittal of the International Search Report and the Written Opinion of the International Searching Authority, or the Declaration, date of mailing Nov. 5, 2008, International Application No. PCT/US 08/51753, International filing date Jan. 23, 2008.

* cited by examiner

*Primary Examiner*—Linh V Nguyen
(74) *Attorney, Agent, or Firm*—John J. Patti; Wade J. Brady, III; Frederick J. Telecky, Jr.

(57) ABSTRACT

Various systems and methods for analog to digital conversion are disclosed. For example, some embodiments of the present invention provide analog to digital conversion systems. The analog to digital conversion systems include a first integrator and a second integrator, and a first summation element and a second summation element. An output of the first summation element is electrically coupled to the first integrator, and an output of the first integrator is electrically coupled to the second integrator. An output of the second integrator is electrically coupled to the second summation element. The analog to digital conversion systems further include an analog to digital converter that is electrically coupled to the first summation element via a digital to analog converter. An input to the analog to digital conversion system is electrically coupled to the first summation element, and the input is electrically coupled to the second summation element via a kickback filter.

5 Claims, 4 Drawing Sheets

SYSTEMS AND METHODS FOR KICKBACK REDUCTION IN AN ADC

BACKGROUND OF THE INVENTION

The present invention is related to analog to digital conversion, and more particularly to systems and methods for reducing kickback in relation to analog to digital conversion.

Turning to FIG. 1, an analog to digital conversion system 100 including a Delta-Sigma Modulator is shown. Analog to digital conversion system 100 includes two integrators 110, 120, two summation elements 150, 160, a digital to analog converter 140, and an analog to digital converter 130. An input signal (u) and a feedback signal from digital to analog converter 140 are aggregated by summation element 150. The aggregate from summation element 150 is applied to integrator 110. The output of integrator 110 is aggregated with the feedback signal from digital to analog converter 140 using summation element 160. The aggregate from summation element 160 is applied to integrator 120, and the output of integrator 120 is applied to analog to digital converter 130. The output (v) of analog to digital converter 130 is a digital representation of the aforementioned input signal (u), and is provided to digital to analog converter 140 to create the previously discussed feedback.

Analog to digital conversion system 100 is typically used in low bandwidth applications such as digital telephony and digital audio which rely on high oversampling ratios to achieve the desired signal to noise ratio and linear performance. In contrast, analog to digital conversion system 100 does not work well at low oversampling ratios (i.e., oversampling ratios less than eight to sixteen) due primarily to non-linearities caused by variations in manufacturing processes and circuit imperfections. In some cases, analog to digital conversion system 100 has been implemented with high quality analog components to address some of the causes of the aforementioned non-linearities, however, even with the use of such high quality components analog to digital conversion system 100 is generally not capable of adequate operation at low oversampling rates (i.e., eight to sixteen or less).

Turning to FIG. 2, another analog to digital conversion system 200 including a Delta-Sigma Modulator is shown. Analog to digital conversion system 200 has been proposed to address some of the limitations of analog to digital conversion system 100. Similar to analog to digital conversion system 100, analog to digital conversion system 200 includes two integrators 210, 220, a digital to analog converter 240, and an analog to digital converter 230. Three summation elements 250, 260, 270 are also included. An input signal (u) and a feedback signal from digital to analog converter 240 are aggregated by summation element 250. The result of the aggregation is the difference between the input signal (u) and the output signal (v), or the error (e). The aggregate from summation element 250 is applied to integrator 210. The output of integrator 210 is applied to integrator 220. The output of integrator 220 is applied to summation element 260. In addition, the output of integrator 210 is fed forward via an amplifier 280 to summation element 260. The output from summation element 260 is summed with the input signal (u) in summation element 270, and the output of summation element 270 is applied to analog to digital converter 230. The output (v) of analog to digital converter 230 is a digital representation of the aforementioned input signal (u), and is provided to digital to analog converter 240 to create the previously discussed feedback.

While analog to digital conversion system 200 substantially alleviates the previously discussed linearities of analog to digital conversion system 100, it has not found much use in high bandwidth implementations. This is because the circuit has a tendency to be very noisy at or near the band of interest. The level of noise seems to be less when the circuit is used at relatively high oversampling rates (i.e., eight to sixteen or greater), but renders the circuit unreliable at lower oversampling rates.

Thus, for at least the aforementioned reasons, there exists a need in the art for advanced systems and methods for analog to digital conversion.

BRIEF SUMMARY OF THE INVENTION

The present invention is related to analog to digital conversion, and more particularly to systems and methods for reducing kickback in relation to analog to digital conversion.

Various systems and methods for analog to digital conversion are disclosed. For example, some embodiments of the present invention provide analog to digital conversion systems that include a first integrator and a second integrator, and a first summation element and a second summation element. An output of the first summation element is electrically coupled to the first integrator, and an output of the first integrator is electrically coupled to the second integrator. An output of the second integrator is electrically coupled to the second summation element. The analog to digital conversion systems further include an analog to digital converter that is electrically coupled to the first summation element via a digital to analog converter. An input to the analog to digital conversion system is electrically coupled to the first summation element, and the input is electrically coupled to the second summation element via a kickback filter In some instances of the aforementioned embodiments, the kickback filter is a buffer, while in other instances of the aforementioned embodiments the kickback filter is a band pass filter. Such a kickback filter is operable to reduce or eliminate noise evident at the input of the second summation element from kicking back onto the input signal. In some instances of the aforementioned embodiments, another integrator is electrically coupled between the first integrator and the second summation element. In such cases, the second integrator is electrically coupled to the summation element. In some instances of the aforementioned embodiments, the integrators are implemented with a switch network on either side of a sampling capacitor.

Other embodiments of the present invention provide kickback limited Delta-Sigma Modulators. Such kickback limited Delta-Sigma Modulators include an integrator, a first summation element and a second summation element, and an analog to digital converter. An output of the first summation element is electrically coupled to the integrator; an output of the analog to digital converter is electrically coupled to the first summation element; and an output of the second summation element is electrically coupled to the analog to digital converter. An input signal is applied to the first summation element directly, and to the second summation element via a kickback filter. The kickback filter is operable to reduce or eliminate kickback noise from the node electrically coupled to the second summation element to the input signal.

In some instances of the aforementioned embodiments, the kickback filter is a buffer. In other instances of the aforementioned embodiments, the kickback filter is a band pass filter. In some cases, the band pass filter is implemented as an RC network. In various cases, the kickback filter is electrically coupled to the second summation element via a switch network. Where a band pass filter is used in such cases, it is tuned to disallow passage of noise at frequencies generated by operation of one or more switches in the switch network. In various instances of the aforementioned embodiments, two integrators are used. In such instances, an output from the first integrator is electrically coupled to the second integrator, and an output from the second integrator is electrically coupled to the second summation element. In such cases, the output from the first integrator is electrically coupled to the second summation element via a gain element that exhibits a gain of two.

In some cases of the aforementioned embodiments, the Delta-Sigma Modulator further includes an analog to digital converter that is electrically coupled to the first summation element via the digital to analog converter. In various instances of the aforementioned embodiments, the integrators are preceded by switch networks that include a set of switches on either side of a sampling capacitor.

Yet other embodiments of the present invention provide methods for reducing kickback in an analog to digital converter. Such methods include providing an integrator, an analog to digital converter, a first summation element and a second summation element. The methods further include electrically coupling an output of the first summation element to the integrator; electrically coupling an output of the analog to digital converter to the first summation element; electrically coupling an output of the second summation element to the analog to digital converter; applying an input signal to the first summation element; and applying the input signal to the second summation element via a kickback filter. In such cases, the kickback filter is operable to limit noise coupling between the second summation element and the input signal.

In some instances of the aforementioned methods, the kickback filter is a buffer, while in other instances of the aforementioned methods the kickback filter is a band pass filter. In some instances of the aforementioned embodiment, the methods further include providing a switch network, and electrically coupling the kickback filter to the second summation element via a switch network. In such cases, the band pass filter is tuned to disallow passage of noise at frequencies generated by operation of one or more switches in the switch network.

In some instances of the aforementioned embodiments, another integrator is electrically coupled between the first integrator and the second summation element. In such cases, the second integrator is electrically coupled to the summation element. In some instances of the aforementioned embodiments, the summation elements are implemented with a switch network on either side of a sampling capacitor. In various instances of the aforementioned embodiments, the methods further include providing a digital to analog converter. In such cases, the output of the analog to digital converter is electrically coupled to the first summation element via the digital to analog converter.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to analog to digital conversion, and more particularly to systems and methods for reducing kickback in relation to analog to digital conversion.

Various systems and methods for analog to digital conversion are disclosed. For example, some embodiments of the present invention provide analog to digital conversion systems based on Delta-Sigma modulation. Some such analog to digital conversion systems include a Delta-Sigma modulator with a feed forward path that electrically couples an analog voltage input to a summation element directly preceding an analog to digital converter that provides a digital representation of the input. The analog input is electrically coupled to the summation element via a kickback filter that eliminates or reduces the amount of noise at or around the summation element that can be introduced back onto the input signal. This allows the analog to digital conversion system to operate at higher frequencies without undue regard to circuit imperfections and circuit changes due to changing operational conditions. As used herein, the phrase "electrically coupled" is used in its broadest sense to mean any coupling whereby an electrical signal from one node may be transferred either directly or indirectly to another node. Thus, for example, two nodes may be electrically coupled by a wire that electrically connects the two nodes. Further, two nodes may be electrically coupled by a switch that is intermittently opened and closed. Alternatively, two nodes may be electrically coupled indirectly via a buffer, filter (active or passive), or other device placed between the two nodes. Based on the disclosure provided herein, one of ordinary skill in the art will recognize a variety of manners in which two nodes may be electrically coupled.

Figure 1:
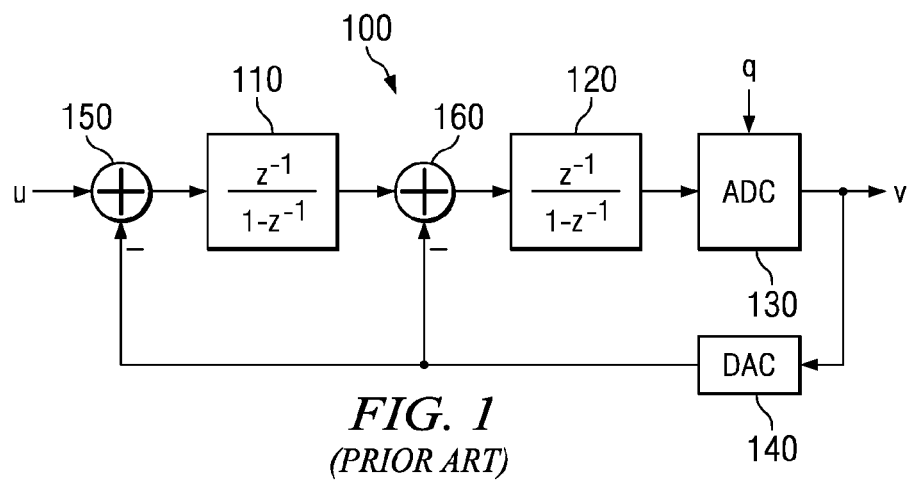
FIG. 1 illustrates a block diagram of an existing analog to digital conversion system.
Figure 2:
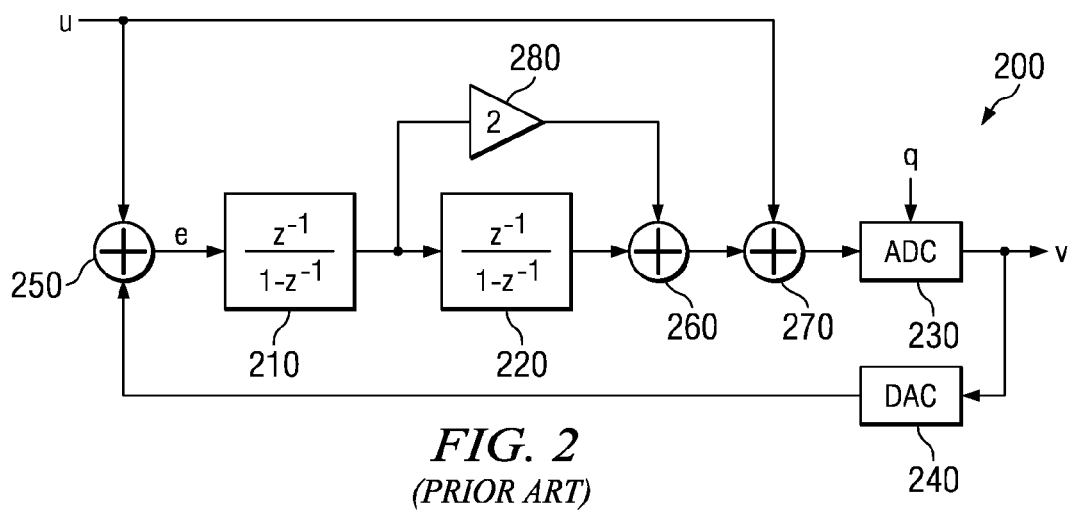
FIG. 2 is a block diagram of another existing analog to digital conversion system comprising a distortion cancellation network that includes a feed forward path.
Figure 3B:
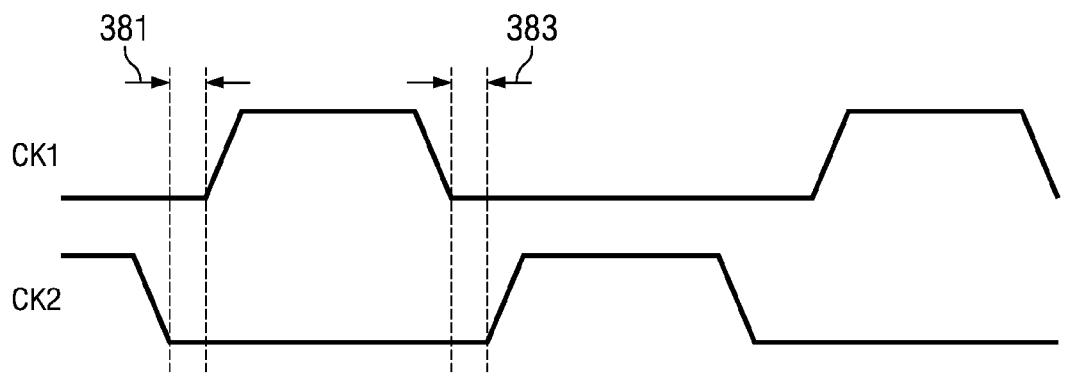
FIGS. 3b-3d show timing diagrams used to describe the operation of the circuit of FIG. 3a, and problems discovered in relation to operating the circuit.
Figure 3A:
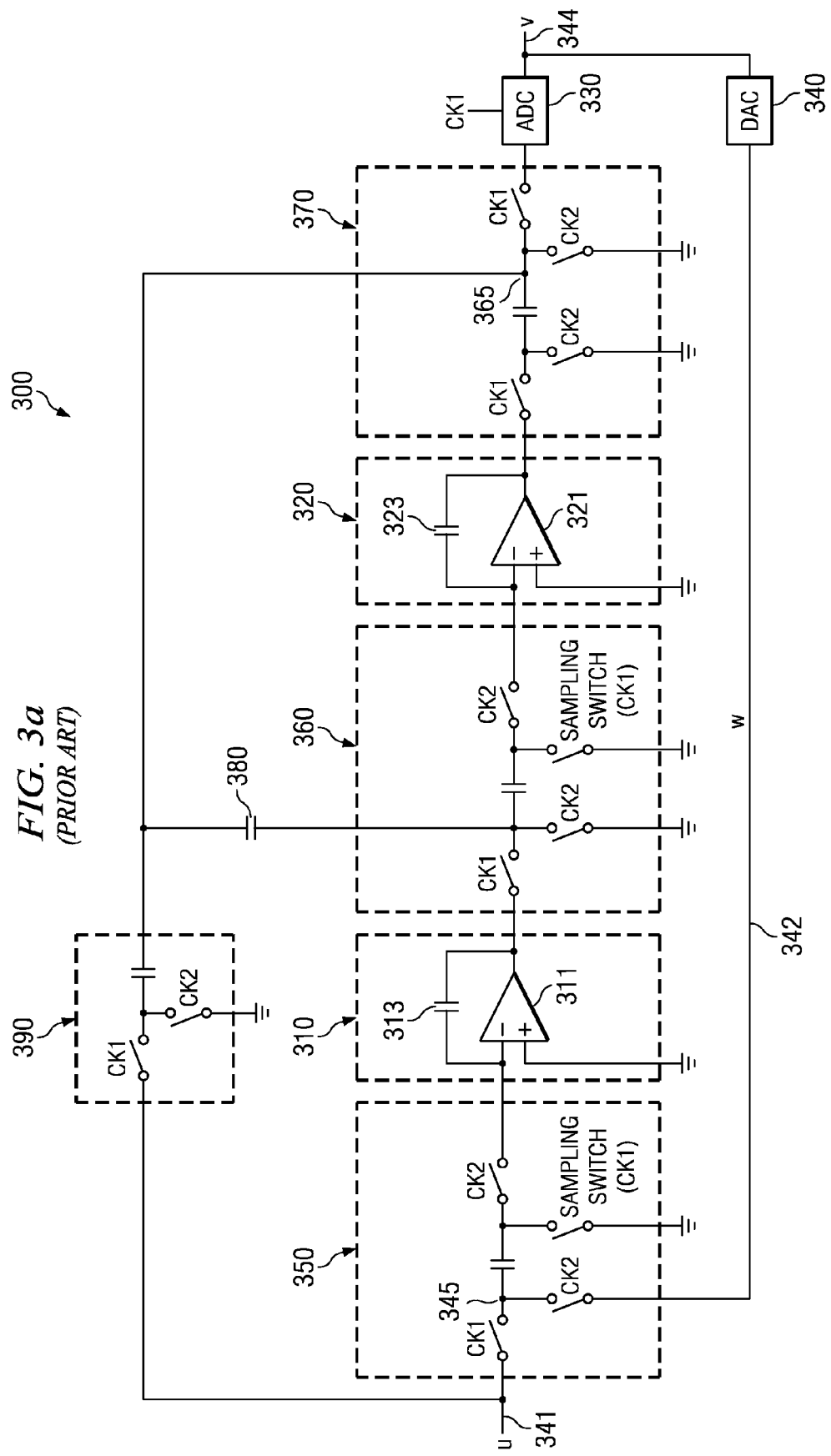
FIG. 3a shows a schematic diagram of a particular implementation of the circuit of FIG. 2.

Turning to FIG. 3a, a schematic diagram of an analog to digital conversion system 300 is shown. Analog to digital conversion system 300 is a particular implementation of analog to digital conversion system 200 and is useful to discuss the source of noise that has been discovered and is considered at least one reason why analog to digital conversion system 200 has not proven useful for higher bandwidth (i.e., lower oversampling rates) as mentioned above in relation to FIG. 2.

Analog to digital conversion system 300 includes two integrators 310, 320, a digital to analog converter 340, and an analog to digital converter 330. Two summation elements 345, 365 are also included. Integrator 310 includes an operational amplifier 311 connected with a feedback capacitor 313. A switch network 350 precedes integrator 310. It should be noted that the phrase "switch network" is used in its broadest sense to mean any combination of switches and in some cases other elements. In this case, switch network 350 (and some other switch networks discussed herein) operates as a sampling network. The output of integrator 310 is provided to integrator 320 via a switch network 360. Integrator 320 includes an operational amplifier 321 connected with a feedback capacitor 323. The output of integrator 320 is electrically coupled to a switch network 370 that surrounds a summation element 365. The output of integrator 310 is also electrically coupled to summation element 365 via a capacitor 380. Where a gain of two is desired, capacitor 380 is selected to be twice the size of other capacitors in analog to digital conversion system 300.

In operation, an input signal (u) 341 is summed with a feedback signal (w) 342 through the operation of switch network 350. Feedback signal (w) 342 is an analog equivalent of an output (v) 344 of analog to digital conversion system 300. The output of switch network 350 represents the difference between input signal (u) 341 and output (v) 344, or the error. Switch network 350 operates by closing switches labeled CK1 on one phase of a synchronizing clock and closing switches labeled CK2 on the other phase of the synchronizing clock. During this switching process, the capacitor between the sets of switches stores a charge that ultimately represents the previously described error signal, and applies the error signal to integrator 310. The output of integrator 310 is applied to integrator 320 via another switch network 360. Switch network 360 operates by closing switches labeled CK1 on one phase of the synchronizing clock and closing switches labeled CK2 on the other phase of the synchronizing clock. This causes the output of integrator 310 to be sampled and applied to the input of integrator 320. Further, the output of integrator 310 is electrically coupled to a summation element 365 (i.e., node 365) via a capacitor 380 that is in parallel to integrator 320. The capacitive value of capacitor 380 is twice that of other capacitors in analog to digital conversion system 300 resulting in a gain of two through integrator 320.

The output of integrator 320 is also electrically coupled to summation element 365 via a switch of switch network 370. Yet further, input signal (u) 341 is electrically coupled to summation element 365 via a switch network 390. Switch network 390 operates by closing the switch labeled CK1 on one phase of the synchronizing clock and closing the switch labeled CK2 on the other phase of the synchronizing clock. This causes input signal 341 to be sampled during each clock period with the sample being transferred to summation element 365 where it is summed with the output of integrator 320 and the output of capacitor 380. A switch of switch network 370 electrically couples summation element 365 to analog to digital controller 330. Switch network 370 operates by closing switches labeled CK1 on one phase of the synchronizing clock and closing switches labeled CK2 on the other phase of the synchronizing clock. This causes the summation element 365 to be applied to analog to digital controller 330.

Output (v) 344 of analog to digital converter 330 is a digital representation of input signal (u) 341. In addition to being used as an output, output (v) 344 of analog to digital converter 330 is applied as the input of digital to analog converter 340, and based on this input, digital to analog converter creates feedback signal (w) 342 (i.e., an analog representation of the output (v) 344). As previously discussed, feedback signal (w) 342 is aggregated with input signal (u) 341 at summation element 345. Again, this aggregation results in an error value (i.e., the difference between input signal (u) 341 and output signal (v) 344) being applied to integrator 310).

Turning to FIG. 3b, a timing diagram shows an example of CK1 in relation to CK2. As shown, dead bands 381, 383 are designed between the times when CK1 and CK2 are asserted high. It was discovered that poorly controlled closure of switches marked CK1 results in noise being passed from analog to digital converter 330 back on to input (u) 341 via switches of switch network 370 and switch network 390. This noise is referred to herein as kickback noise. In particular, where the version of CK1 that is applied to analog to digital converter 330 de-asserts before the version of CK1 applied to the other switches of analog to digital conversion system 300, kickback noise is possible.

Figure 3C:
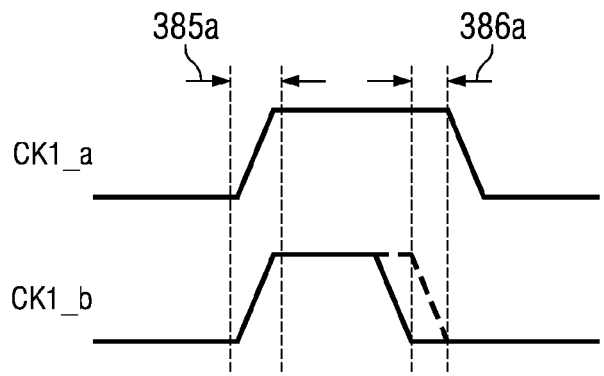
Figure 3D:
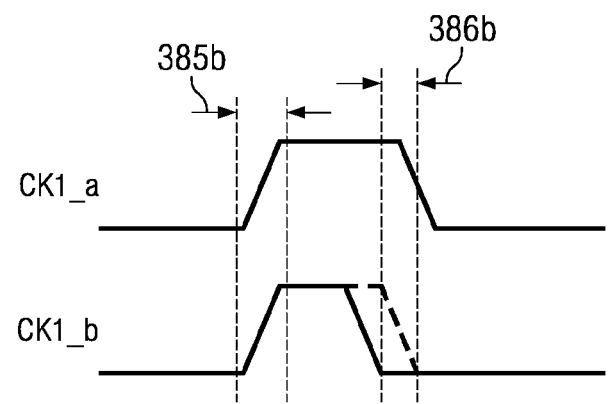

One solution for limiting or avoiding kickback noise is to tightly control clocks applied to the various switches and devices of analog to digital conversion system 300. Such tight control is directed toward guaranteeing that the version of CK1 applied to analog to digital converter 330 will latch the input of converter 330 after the version of CK1 applied to the switches labeled "sampling switch" under all operating conditions. Such an approach offers hope for relatively low bandwidth operation of analog to digital conversion system 300 due to the long period of CK1, however, due to circuit imperfections and routing parasitics, it may not be possible to guarantee desired operation for higher bandwidth implementations. Turning to FIG. 3c, a desirable timing between the version of CK1 (CK1_a) that is applied to analog to digital converter 330 and the version of CK1 (CK1_b) applied to the other switches in analog to digital conversion system is shown. In particular, the rising edges of CK1_a and CK1_b may occur relative to each other anywhere in a skew range 385a. Further, the CK1_b is guaranteed to be de-asserted sometime during a de-assertion period 386a depending upon various design realities. This guarantees that the falling edge of CK1_b will occur before the falling edge of CK1_a. In contrast, as shown in FIG. 3d, where the period of CK1 is reduced (i.e., a higher bandwidth operation of analog to digital conversion system 300 is implemented) for the same skew range 385 and de-assertion period 386, it is not possible to guarantee that CK1_b will be de-asserted before CK1_a. Thus, for higher speed operation of analog to digital conversion system 300 it may not be possible to control clock distribution such that kickback noise is not a problem.

Figure 4:
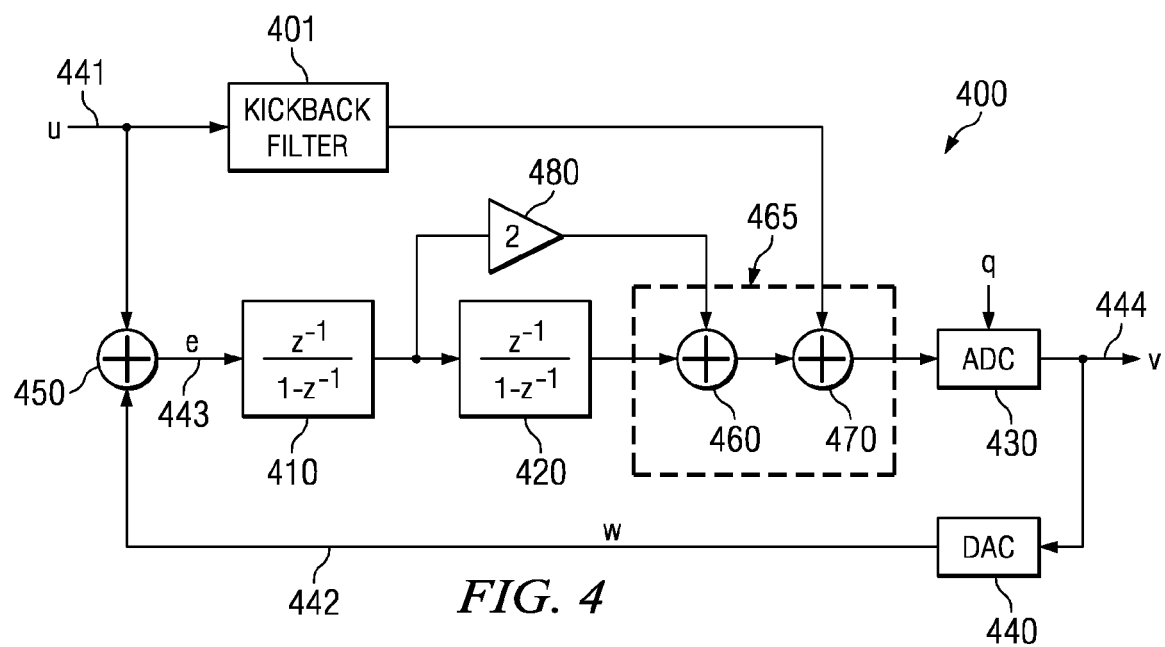
FIG. 4 is a block diagram of an analog to digital conversion system with a kickback reduction filer in accordance with various embodiments of the present invention.

Turning to FIG. 4, a block diagram of an analog to digital conversion system 400 with a kickback reduction filter 401 in accordance with various embodiments of the present invention is shown. Analog to digital conversion system 400 includes two integrators 410, 420, a digital to analog converter 440, and an analog to digital converter 430. Three summation elements 450, 460, 470 are also included. It should be noted that summation elements 460, 470 are each aggregating two input signals, but can be treated as a single summation element 465 that aggregates three input signals. Thus, when a summation element is discussed in the claims below, it may be referring to a two or more input summation element depending upon its context. Said another way, the phrase summation element should not imply only a two input summation element such as summation element 460 or only a three input summation element such as summation element 465.

An input signal (u) 441 and a feedback signal (w) 442 from digital to analog converter 440 are aggregated by summation element 450. The aggregate from summation element 450 is applied to integrator 410. The output of integrator 410 is applied to integrator 420. The output of integrator 420 is applied to summation element 460. In addition, the output of integrator 410 is fed forward via an amplifier 480 to summation element 460. The output from summation element 460 is summed with the input signal (u) 441 in summation element 470, and the output of summation element 470 is applied to analog to digital converter 430. The version of input signal (u) 441 that is applied to summation element 470 is passed through kickback filter 401. An output (v) 444 of analog to digital converter 430 is a digital representation of input signal (u) 441. Output (v) 444 is applied to digital to analog converter 440. In turn, digital to analog converter 440 converts digital output (v) 444 to it analog equivalent, feedback signal (w) 442. Feedback signal (w) 442 is applied to summation element 450 where, as previously discussed, it is aggregated with input signal (u) 441. This aggregation provides an error difference (e) 443 which is the difference between input signal (u) 441 and output signal (v) 444.

In operation, noise that is generated in or about summation element 465 is precluded or limited from passing back to input signal (u) 441 by kickback filter 401. As used herein, the phrase "kickback filter" is used in its broadest sense to mean any filter or device that is capable of reducing or eliminating noise that is in or about summation element 465 from being introduced onto input signal (u) 441. Thus, for example, kickback filter 401 may be a buffer that substantially limits signal to pass in one direction. As another example, kickback filter 401 may be a band pass filter (i.e., a band limiting filter) that is tuned to the frequency of noise that is generated in or about summation element 465. Such a band pass filter may be, for example, an RC network that is tuned to prohibit passage of signals at a frequency band around the frequency of noise that is generated in or about summation element 465. As yet another example, kickback filter 401 may be an operational amplifier based active filter that is tuned to the frequency of noise that is generated in or about summation element 465. Based on the disclosure provided herein, one of ordinary skill in the art will recognize a myriad of other filters and/or devices that may be used to prevent kickback noise from being applied to input signal (u) 441.

Figure 5:
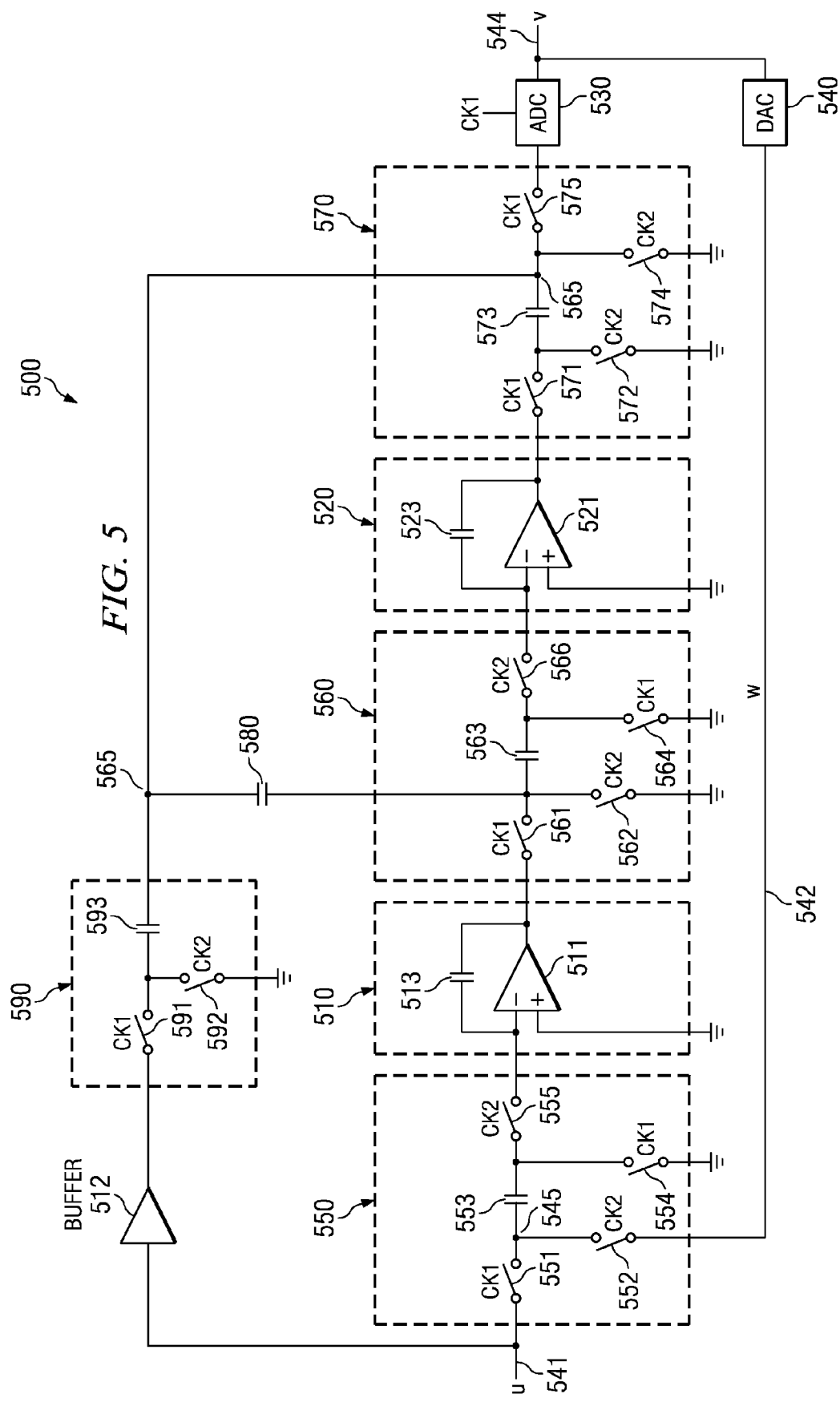
FIG. 5 is an exemplary implementation of the circuit of FIG. 4 in accordance with one or more embodiments of the present invention.

Turning to FIG. 5, a schematic diagram of an analog to digital conversion system 500 is shown in accordance with one or more embodiments of the present invention. Analog to digital conversion system 500 is an exemplary implementation of the circuit of FIG. 4, and as such includes a kickback filter that is implemented as a buffer 510. Analog to digital conversion system 500 includes two integrators 510, 520, a digital to analog converter 540, and an analog to digital converter 530. Integrator 510 includes an operational amplifier 511 with a feedback capacitor 513 electrically coupled between the negative input of operational amplifier 511 and the output of operational amplifier 511. Similarly, integrator 520 includes an operational amplifier 521 with a feedback capacitor 523 electrically coupled between the negative input of operational amplifier 521 and the output of operational amplifier 521. It should be noted that the depicted integrators are merely exemplary, and that one of ordinary skill in the art will recognize one or more integrator implementations that may be utilized in accordance with one or more embodiments of the present invention.

Analog to digital converter 530 is operable to receive an analog voltage signal and to convert the analog voltage signal to a digital representation thereof. In one particular case, analog to digital converter 530 is operable to sample and convert an input analog voltage signal whenever CK1 is asserted high. Analog to digital converter 530 may be any analog to digital converter circuit that is known in the art. Digital to analog converter 540 is operable to receive a digital value and to convert the digital value to an analog voltage signal corresponding to the digital value. Digital to analog converter 540 may be any digital to analog converter circuit that is known in the art.

Analog to digital conversion system 500 further includes two summation elements 545, 565. In this case, the two summation elements are electrically connected circuit nodes where two or more analog voltage signals are applied and thereby aggregated to make a summed (or aggregated) analog voltage signal. In particular, a feedback voltage signal (w) 542 and an input voltage signal (u) 541 are both applied to summation element 545 where they are aggregated to create a difference or error signal. Input signal (u) 541, the amplified output of integrator 510 (i.e., the output of integrator 510 after it is passed through a capacitor 580), and the output of integrator 520 are all applied to summation element 565 where they are aggregated together.

Analog to digital conversion system 500 further includes a number of switch networks 550, 560, 570, 590 where signals can be sampled and passed to the next stage. Switch network 550 includes a switch 551 and a switch 554 that close whenever the clock driving analog to digital conversion system 500 is in the CK1 phase (e.g., the opposite of the CK2 phase as shown in FIG. 3b above). Switch network 550 also includes a switch 552 and a switch 555 that close whenever the clock driving analog to digital conversion system 500 is in the CK2 phase (i.e., the opposite of the CK1 phase). In operation, switch 551 and switch 554 are closed during the CK1 phase which causes a capacitor 553 to be charged to a value representative of input signal (u) 541. In the opposite CK2 phase, switch 551 and switch 554 are opened, while switch 552 and switch 555 are closed. During the CK2 phase, the charge on capacitor 553 is passed to integrator 510 via switch 555. The charge on capacitor 553 is augmented or decremented by the value of feedback signal (w) 542 that is applied to capacitor 553 via switch 552. Thus, the value applied to the input of integrator 510 is the value of input signal (u) 541 less the value of feedback signal (w) 542.

Switch network 560 includes a switch 561 and a switch 564 that close whenever the clock driving analog to digital conversion system 500 is in the CK1 phase. Switch network 560 also includes a switch 562 and a switch 566 that close whenever the clock driving analog to digital conversion system 500 is in the CK2 phase. In operation, switch 561 and switch 564 are closed during the CK1 phase which causes a capacitor 563 to be charged to a value representative of the output of integrator 510. In the opposite CK2 phase, switch 561 and switch 564 are opened, while switch 562 and switch 566 are closed. During the CK2 phase, the charge on capacitor 563 is passed to integrator 520 via switch 566. In addition, during the CK1 phase, the output of integrator 510 is applied to capacitor 580 via switch 561. In some cases, the value of capacitor 580 is twice that of the other capacitors in analog to digital conversion system 500 resulting in a gain of two through integrator 520.

Switch network 570 includes a switch 571 and a switch 575 that close whenever the clock driving analog to digital conversion system 500 is in the CK1 phase. Switch network 570 also includes a switch 572 and a switch 574 that close whenever the clock driving analog to digital conversion system 500 is in the CK2 phase. In operation, switch 571 and switch 575 are closed during the CK1 phase which causes a capacitor 573 to be charged to a value representative of the value at summation element 565, and to transfer that value to the input of analog to digital converter 530 via switch 575. In the opposite CK2 phase, switch 571 and switch 575 are opened, while switch 572 and switch 574 are closed. During the CK2 phase, the charge on capacitor 573 is dissipated to ground.

Switch network 590 includes a switch 591 that closes whenever the clock driving analog to digital conversion system 500 is in the CK1 phase, and a switch 592 that closes whenever the clock driving analog to digital conversion system 500 is in the CK2 phase. In operation, switch 591 closes during the CK1 phase which causes a capacitor 593 to be charged to a value representative of the input signal (u) 541 aggregated with the value at summation element 565. In the opposite CK2 phase, switch 591 is opened, while switch 592 is closed. During the CK2 phase, capacitor 593 is charged to the value at summation element 565.

In operation, input signal (u) 541 is summed with a feedback signal (w) 542 through the operation of switch network 550. The aggregate of input signal (u) 541 and feedback signal (w) 542 represents a difference between digital output (v) 544 (i.e., the digital representation of input signal (u) 541) and input signal (u) 541. This difference is an error that is applied to integrator 510 via switch 555 during the CK2 phase. The error is integrated and the output of integrator 510 is applied to switch network 560. Switch network 560 samples and passes the integrated error value from integrator 510 to integrator 520 and to capacitor 580. In addition, buffer 512 passes input signal (u) 541 to switch network 590 which operates as discussed above. The output of integrator 520, the voltage on capacitor 580 and the voltage on capacitor 593 are all electrically connected (i.e., aggregated) at summation element 565. The voltage at summation element 565 is sampled and passed to analog to digital converter 530 by switch 575 of switch network 570. Analog to digital converter 530 converts the value received from switch network 570 to a digital value (i.e., digital output (v) 544). This digital value is a digital representation of input signal (u) 541. In turn, digital to analog converter 540 converts digital output (v) 544 back to the analog domain as feedback signal (w) 542.

It should be noted that where the versions of CK1 are not carefully controlled there will be some noise evident at summation element 565 for the reasons discussed above in relation to FIG. 3a. However, this noise will not be kickback noise as buffer 510 precludes the noise from being introduced back onto input signal (u) 541 regardless of the relative assertion of CK1 as it is distributed across the various switches and devices. Thus, analog to digital conversion system 500, unlike the prior art implementation discussed above in relation to FIG. 3a is not impeded by kickback noise and is thus capable of use in higher bandwidth applications (or applications with lower over-sampling ratios). It should be noted that buffer 510 may be replaced by any kickback filter. Other types of kickback filters may include, but are not limited to, a band pass filter that is tuned to the frequency of noise that is generated around summation element 565, or an operational amplifier based active filter that is tuned to the frequency of noise that is generated around summation element 565. Based on the disclosure provided herein, one of ordinary skill in the art will recognize a myriad of other filters and/or devices that may be used to prevent kickback noise from being applied to input signal (u) 541.

In conclusion, the present invention provides novel systems, devices, methods for analog to digital conversion. While detailed descriptions of one or more embodiments of the invention have been given above, various alternatives, modifications, and equivalents will be apparent to those skilled in the art without varying from the spirit of the invention. For example, the circuit shown in FIG. 5 is a single ended circuit, but there is a differential equivalent circuit that may be implemented in accordance with various embodiments of the present invention. Therefore, the above description should not be taken as limiting the scope of the invention, which is defined by the appended claims.

What is claimed is:

1. An apparatus comprising:
a unidirectional kickback filter including:
a buffer that is coupled to an input node;
a first switch network coupled to the buffer; and
a capacitor coupled between the first switch network;
a second switch network that is coupled to the input node;
a first integrator that is coupled to the second switch network;
a third switch network that is coupled to the capacitor of the kickback filter and that is coupled to the first integrator;
a second integrator that is coupled to the third switch network;
a fourth switch network that is coupled to the second integrator and that is coupled to the kickback filter;
an ADC that is coupled to the fourth switch network; and
a DAC that is coupled between the ADC and the second switch network.

2. The apparatus of claim 1, wherein the first switch network further comprises:
a second capacitor having a first and a second terminal;
a first switch that is coupled between the buffer and the first terminal of the second capacitor, wherein the first terminal is actuated by a first control signal; and
a second switch that is coupled between the first terminal of the second capacitor and ground, wherein the second switch is actuated by a second control signal.

3. The apparatus of claim 1, wherein each of the second switch network, the third switch network, and the fourth switch network further comprises:
a capacitor having a first terminal and a second terminal, wherein the capacitor is adapted to store a value that is representative of an input signal to the respective switch network;
a first switch coupled between the first terminal of the capacitor and an input node of the respective switch network, wherein the first switch is actuated by a first control signal;
a second switch coupled between the first terminal of the capacitor and ground, wherein the second switch is actuated by a second control signal;
a third switch coupled between the second terminal of the capacitor and ground, wherein the third switch is actuated by the first control signal; and
a fourth switch coupled between the second terminal of the capacitor and an output node of the respective switch network, wherein the fourth switch is actuated by the second control signal.

4. The apparatus of claim 3, wherein the kickback filter is coupled to the first terminal of the capacitor of the third switch network.

5. The apparatus of claim 3, wherein the kickback filter is coupled to the second terminal of the capacitor of the fourth switch network.

* * * * *